(12) United States Patent
Hua

(10) Patent No.: US 7,122,460 B2
(45) Date of Patent: Oct. 17, 2006

(54) ELECTROMIGRATION BARRIER LAYERS FOR SOLDER JOINTS

(75) Inventor: Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/890,684

(22) Filed: Jul. 13, 2004

(65) Prior Publication Data

US 2004/0262778 A1    Dec. 30, 2004

Related U.S. Application Data

(62) Division of application No. 10/609,715, filed on Jun. 30, 2003.

(51) Int. Cl.
*H01L 21/44* (2006.01)
*H01L 21/48* (2006.01)
*H01L 21/50* (2006.01)

(52) U.S. Cl. .................. 438/614; 438/612; 438/613; 438/615; 438/108

(58) Field of Classification Search ........ 438/612–614, 438/108, 615; 257/652–654
See application file for complete search history.

(56) References Cited

U.S. PATENT DOCUMENTS

| | | | |
|---|---|---|---|
| 5,210,939 A | 5/1993 | Mallik et al. |
| 5,261,989 A | 11/1993 | Ueltzen |
| 5,420,461 A | 5/1995 | Mallik et al. |
| 5,506,756 A | 4/1996 | Haley |
| 5,519,580 A | 5/1996 | Natarajan et al. |
| 5,707,247 A | 1/1998 | Konstad |
| 5,751,556 A | 5/1998 | Butler et al. |
| 5,757,071 A | 5/1998 | Bhansali |
| 5,787,575 A | 8/1998 | Banerjee et al. |
| 5,812,379 A | 9/1998 | Barrow |
| 5,880,530 A | 3/1999 | Mashimoto et al. |
| 5,883,783 A | 3/1999 | Turturro |
| 5,889,652 A | 3/1999 | Turturro |
| 5,889,655 A | 3/1999 | Barrow |
| 5,893,725 A | 4/1999 | Bhansali |
| 5,898,222 A | 4/1999 | Farooq et al. |
| 5,966,020 A | 10/1999 | Rampone et al. |
| 6,016,852 A | 1/2000 | Mallik et al. |
| 6,030,854 A | 2/2000 | Mashimoto et al. |
| 6,031,283 A | 2/2000 | Banerjee et al. |
| 6,043,559 A | 3/2000 | Banerjee et al. |
| 6,088,915 A | 7/2000 | Turturro |
| 6,118,182 A | 9/2000 | Barrow |

(Continued)

FOREIGN PATENT DOCUMENTS

JP  2000-150574  *  5/2000  .......... 21/60

OTHER PUBLICATIONS

Riet Labie, et al. "Investigation of Co UBM for Direct Bumping on CU/LowK Dies", 2003 Electronics Components and Technology Conference. pp. 1230-1234.

*Primary Examiner*—Nitin Parekh
(74) *Attorney, Agent, or Firm*—Blakely, Sokoloff, Taylor & Zafman LLP

(57) ABSTRACT

A microelectronic package is disclosed including a microelectronic device, a substrate, and a signaling path coupling the microelectronic device with the substrate. The signaling path includes a conductive material, a solder joint, and a barrier material disposed between the conductive material and the solder joint. The barrier material may include nickel, cobalt, iron, titanium, and combinations thereof.

16 Claims, 5 Drawing Sheets

U.S. PATENT DOCUMENTS

| | | |
|---|---|---|
| 6,120,885 A | 9/2000 | Call et al. |
| 6,177,729 B1 * | 1/2001 | Benenati et al. ............ 257/738 |
| 6,206,272 B1 | 3/2001 | Waldron-Floyde et al. |
| 6,238,948 B1 | 5/2001 | Ramalingam |
| 6,242,803 B1 | 6/2001 | Khandros et al. |
| 6,271,111 B1 * | 8/2001 | Farooq et al. ............... 438/614 |
| 6,281,581 B1 | 8/2001 | Desai et al. |
| 6,307,160 B1 * | 10/2001 | Mei et al. .................... 174/256 |
| 6,312,830 B1 | 11/2001 | Li et al. |
| 6,331,446 B1 | 12/2001 | Cook et al. |
| 6,359,372 B1 | 3/2002 | Dujari et al. |
| 6,365,500 B1 * | 4/2002 | Chang et al. ............... 438/614 |
| 6,365,973 B1 | 4/2002 | Koning |
| 6,413,849 B1 | 7/2002 | Yeoh et al. |
| 6,429,383 B1 | 8/2002 | Sprietsma et al. |
| 6,440,770 B1 | 8/2002 | Banerjee et al. |
| 6,452,502 B1 | 9/2002 | Dishongh et al. |
| 6,461,954 B1 | 10/2002 | Li et al. |
| 6,489,557 B1 | 12/2002 | Eskildsen et al. |
| 6,490,166 B1 | 12/2002 | Ramalingam et al. |
| 6,498,086 B1 | 12/2002 | Zheng et al. |
| 6,509,530 B1 | 1/2003 | Pearson et al. |
| 6,512,861 B1 | 1/2003 | Chakravorty et al. |
| 6,521,996 B1 | 2/2003 | Seshan |
| 6,528,345 B1 | 3/2003 | Cook et al. |
| 6,535,386 B1 | 3/2003 | Sathe et al. |
| 6,548,386 B1 * | 4/2003 | Kondo et al. ............... 438/572 |
| 6,610,591 B1 * | 8/2003 | Jiang et al. ................. 438/613 |

* cited by examiner

ELECTROMIGRATION BARRIER LAYERS FOR SOLDER JOINTS

The present application is a divisional of U.S. patent application Ser. No. 10/609,715 filed Jun. 30, 2003, entitled "ELECTROMIGRATION BARRIER LAYERS FOR SOLDER JOINTS", currently pending. The U.S. patent application Ser. No. 10/609,715 is hereby incorporated herein by reference.

BACKGROUND

1. Field

An embodiment of the invention relates to an interconnect structure for a microelectronic package. In particular, the embodiment relates to an interconnect structure containing an electromigration barrier layer for a solder joint.

2. Background Information

Electromigration of metals in interconnect structures is a tenacious problem in the microelectronic packaging industry. Electromigration generally refers to the movement of atoms of a metal or other conductor in the direction of electron flow during operation. Such migration or movement of the metal may cause cracks, voids, solder joint separations, or other defects to form within the interconnect structure. The formation of such defects due to electromigration represents a significant problem and may lead to premature failure of the microelectronic package. Potentially compounding this problem is the principle that electromigration generally increases with increasing current density, and the general past and present trend toward ever-smaller interconnect structures having ever-higher current densities.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
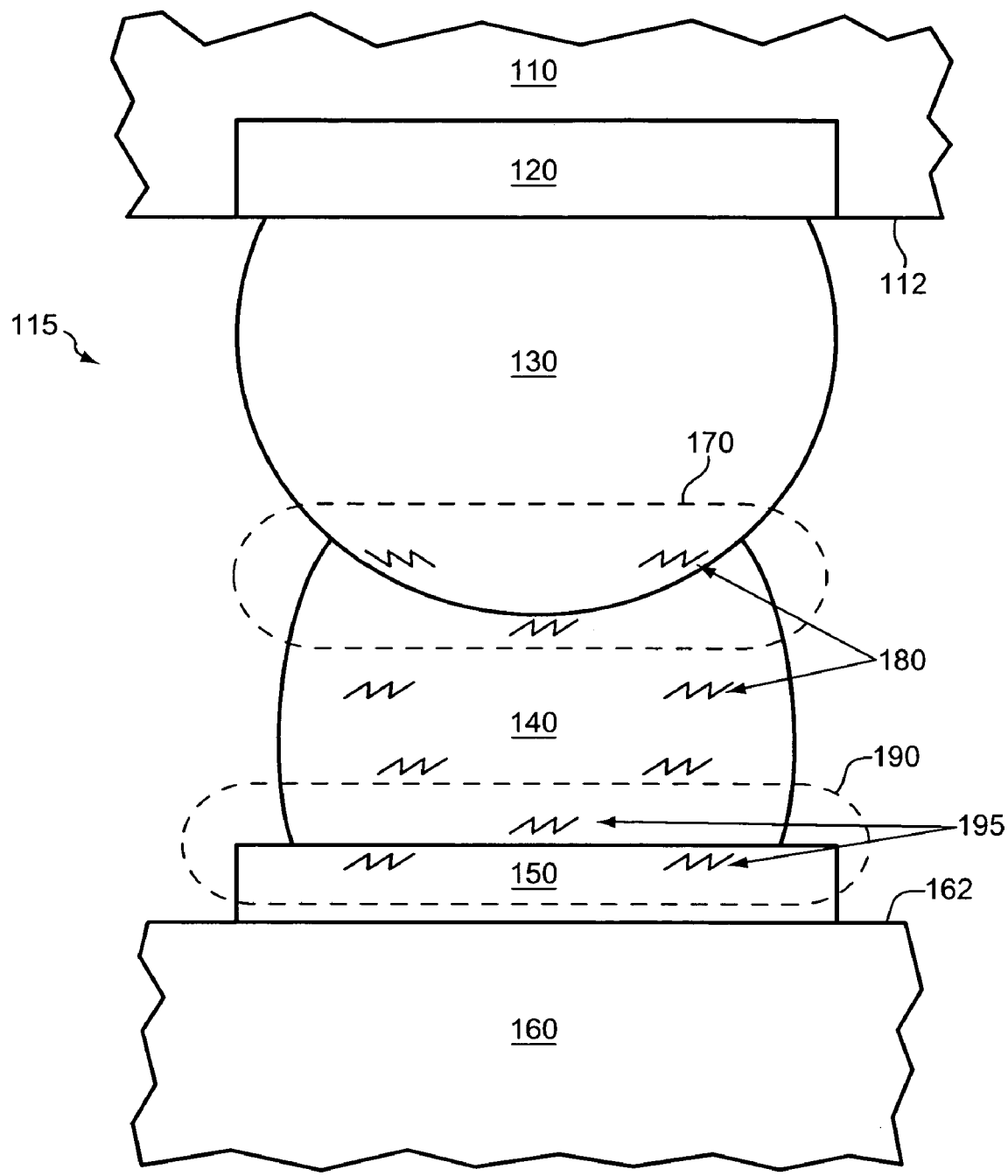
FIG. 1 shows a cross-sectional view of a portion of a flip chip microelectronic package containing a representative interconnect structure in which cracks or other defects have formed due at least in part to electromigration.

FIG. 1 shows a cross-sectional view of a portion of a flip chip microelectronic package containing a representative interconnect structure 115 in which cracks or other defects 180, 190 have formed due at least in part to electromigration. The microelectronic package includes a microelectronic device 110, such as a semiconductor die, the interconnect structure 115, and a substrate 160, such as a printed circuit board.

The illustrated interconnect structure 115 includes an under bump metallurgy 120 embedded in an active surface 112 of the microelectronic device and a copper bump 130 or copper-containing bump attached with the microelectronic device under the under bump metallurgy. The copper bump attached to the under bump metallurgy has a relatively high melting point temperature, and is generally unsolderable, at least under the conditions used to form a solder joint. Also included in the illustrated interconnect structure is a copper-containing pad 150 overlying a contact surface 162 of the substrate. A representative copper-containing pad may include a copper-nickel-copper stack.

A tin-containing solder joint 140 is included in the interconnect structure between the copper containing bump 130 and the copper-containing pad 150 to physically and electrically connect the microelectronic device 110 with the substrate 160. The solder joint may be formed from a solder bump initially attached over the pad by placing the microelectronic device over the substrate, with the copper bump aligned over the solder bump, and reflowing the solder bump into a solder joint connecting the pad with the copper bump. A representative tin-containing solder joint is a tin-lead solder joint.

A first interfacial region 170 is shown near an interface between the bump and the solder joint, and a second interfacial region 190 is shown at an interface between the pad and the solder joint. The inventor has observed that cracks 180, 195 or other defects tend to form at or around the interfacial regions. Often, the defects occur inside the solder joint near the interface between the solder joint and interfacial reaction products, sometimes referred to as intermetallic compounds. Some defects may be found inside the intermetallic compounds, although it is likely that the defects form in the solder joint, and are then encompassed during subsequent growth of the intermetallic compounds. The cracks represent a significant problem in microelectronic packaging industry and may lead to premature failure. The problem may become even more significant if the past and present trend toward smaller interconnect structures, and ever-higher current densities, is to continue.

Interfacial reaction products, such as tin-copper intermetallic compounds (IMCs), tend to form in the interfacial regions due to chemical reactions. Two common copper-tin IMCs are $Cu_6Sn_5$ and $Cu_3Sn$. $Cu_6Sn_5$ generally begins to form at the interface between the solder joint and the copper bump soon after melting the tin-containing solder during reflow. The $Cu_6Sn_5$ begins to grow where the solder contacts the copper of the bump (or the pad) and generally shows rapid early growth, while the solder remains molten, and thereafter slows considerably as the solder joint solidifies. The $Cu_6Sn_5$ IMC generally improves adhesion of the solder joint to the copper of the bump or the pad. The other IMC, $Cu_3Sn$, generally forms between the $Cu_6Sn_5$ and the copper bump (or the pad). The growth of $Cu_3Sn$ generally occurs after solidification of the solder joint, as a result of solid-state diffusion, and electromigration. In certain cases the $Cu_3Sn$ may form during high temperature operations such as bake or reflow once the concentration of tin begins to be depleted by the creation of $Cu_6Sn_5$. Generally the $Cu_6Sn_5$ and the $Cu_3Sn$ compounds continue to grow over time as a result of diffusion and electromigration.

The IMCs may potentially contribute to crack formation. They may react with and retain migrating metal. They also generally have different coefficients of thermal expansion than materials employed in the bumps or solder joints. The differences in the coefficients of thermal expansion may cause thermo-mechanical stresses on the solder joint during the routine temperature excursions or cycles encountered during device operation. These stresses may help to form or enlarge cracks.

The formation of cracks and voids in solder joints may be related to the net flux of metal atoms out of the solder joint. Several of the more significant driving forces affecting metal flux in solder joints are electromigration, back stress, chemical gradient driven diffusion, and temperature gradient driven diffusion. Electromigration generally contributes significantly to metal flux. During device operation, when current passes through an interconnect structure, the metal atoms may migrate, or electromigrate, in the direction of electron flow. The movement is often referred to in the arts as the flow of metal atoms in the direction of an "electron wind" from the cathode to the anode. A back stress is generally present in the reverse direction of the electron wind, although this driving force is generally small in interconnect structures.

The rates of each of these driving forces are generally directly proportional to, or at least directly related to, the solid-state diffusion coefficient. In the case of a tin-containing solder joint, the overall flux of a metal is directly related to the solid-state diffusion coefficient of the metal in tin. The inventor has found that, if the solid-state diffusion coefficient is reduced, then the overall metal flux out of the solder joint due to electromigration and other driving forces is also reduced. This generally delays the formation of voids, lends better solder joint reliability, and may help to extend the operational life of the device.

The inventor has discovered electromigration barrier materials and structures that may be employed in interconnect structures to help reduce the formation of cracks and other defects caused at least in part by electromigration. The inventor believes these electromigration barrier materials and structures may significantly reduce the formation of cracks, allow significantly higher current densities to be employed, and may otherwise advance the state of the art.

Figure 2:
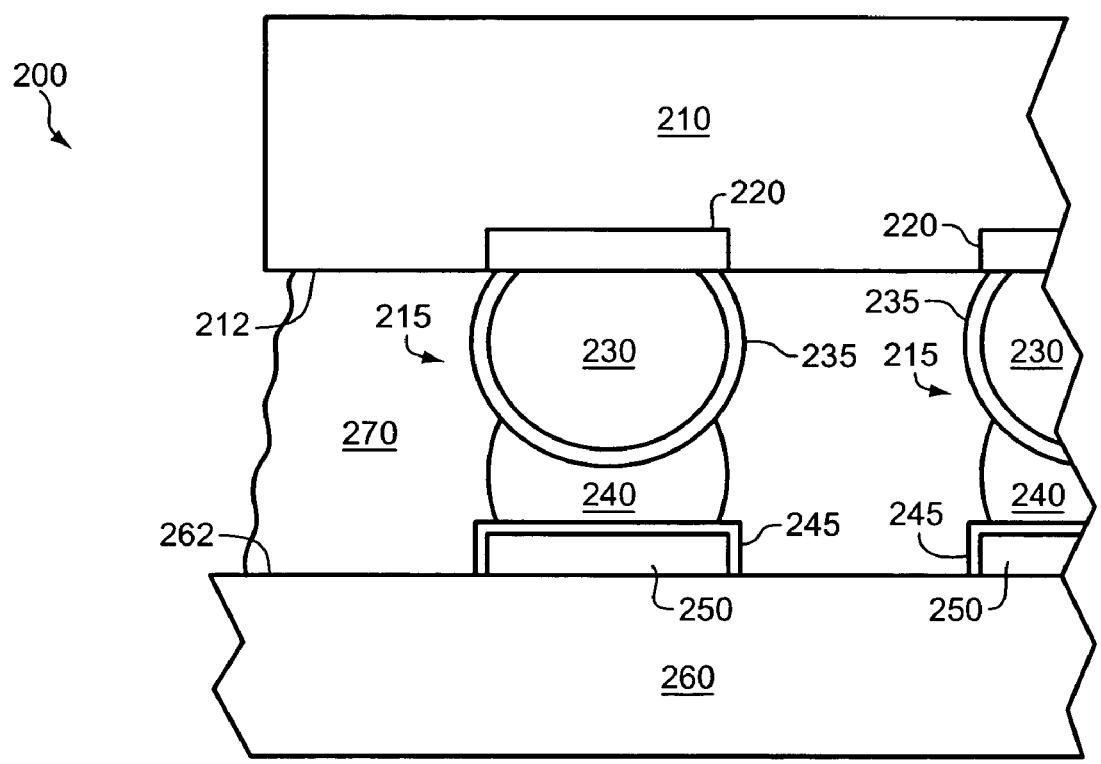
FIG. 2 shows a cross-sectional view of a portion of a flip chip microelectronic package containing an interconnect structure having electromigration barrier materials disposed between a bump and a solder joint, and between the solder joint and a pad, according to one embodiment of the invention.

FIG. 2 shows a cross-sectional view of a portion of a flip chip microelectronic package 200, according to one embodiment of the invention. The flip chip microelectronic package contains a microelectronic device 210, such as a semiconductor die, a substrate 260, such as a printed circuit board, a plurality of interconnect structures 215 disposed between the microelectronic device and the substrate and coupling the microelectronic device with the substrate, and an optional underfill material 270 disposed between the microelectronic device and the substrate around the interconnect structures.

The illustrated interconnect structures 215 each include, from top-to-bottom, an under bump metallurgy 220, a bump 230, a first barrier material 235, a solder joint 240, a second barrier material 245, and a pad 250. At least a portion of the first electromigration barrier material 235 is disposed between the bump 230 and the solder joint 240. At least a portion of the second electromigration barrier material 245 is disposed between the solder joint 240 and the pad 250.

Suitable barrier materials include, but are not limited to, nickel, cobalt, titanium, iron, and combinations thereof. The barrier materials may include layers, caps, or other structures having a thickness between the solder joint and either the bump or the pad, which is in a range between about 0.01 to 20 µm, or about 0.05 to 10 µm. The barrier materials may be formed over the bump or the pad by approaches that include, but are not limited to, depositions, such as physical vapor deposition, and plating, such as electroplating or electroless plating. Such barrier materials may help to prevent contact between materials of the bump, the pad, and the solder joint, and may potentially prevent, or at least delay, the formation of tin-copper IMCs. Such barrier materials may also help to slow the intermixing of materials on opposite sides thereof due to migration or electromigration. These barrier materials may help to prevent, or at least reduce, the formation of cracks and other defects formed due at least in part to electromigration, and may generally improve the reliability of microelectronic packages.

The interconnect structures represent signaling paths or signaling mediums coupling the substrate with the microelectronic device. The terms solder joint, bump (or pad), contact, interconnect structure, conductive path, signaling path, and signaling medium, generally appear in order from more specific at the beginning of the list to more general at the end. In this field, bumps and pads are sometimes referred to simply as contacts. The contacts, solder joints, and electromigration barrier materials represent interconnect structures that may provide paths for carrying signals and coupling or interconnecting electrical circuitry. The interconnect structures generally contain conductive materials, often metals, to carry signals and other forms of electrical current. As used herein, unless specified otherwise, the term metal includes pure metals, metals having other trace components, alloys, eutectics, IMCs, other combinations or mixtures of metals, and metals mixed with metalloids or non-metals, as long as the combination is conductive. Conductive materials besides metals may also optionally be employed in the interconnect structures. For example, the pads may include doped semiconductors, such as doped silicon, or refractory metal silicides.

The illustrated interconnect structure is not required, and other interconnect structures known in the arts may also optionally be employed. For example, the under bump metallurgy, while often appropriate, is not required. As another example, the pad, while illustrated above the contact surface of the substrate, may also be embedded flush with the surface of the substrate. Other modifications of the interconnect structures are also possible as long as the interconnect structures include a solder joint, and either a bump or a pad, between which an electromigration barrier material may be disposed.

Referring again to FIG. 2, the bump 230 is coupled with an active surface 212 of the microelectronic device 210 through the under bump metallurgy 220. Suitable microelectronic devices include, but are not limited to, chips, dice, integrated circuits, monolithic devices, and semiconductor devices as they are generally understood in the arts. Various types of logic and circuitry are suitable. Examples of suitable microelectronic devices include, but are not limited to, processors (for example microprocessors), ASICs (Application Specific Integrated Circuits), and high end DSPs (Digital Signal Processors). The microelectronic devices may be employed singly, as in chip on board, or single chip modules, or as pluralities, as in multiple chip modules. The active surface of the die or other microelectronic device faces the substrate, as in flip chip devices. The active surface may contain active components, such as transistors, diodes, and other electronic components that can operate on an applied signal conveyed through the interconnect structures.

Various under bump metallurgies 220 are known in the arts. A representative under bump metallurgy may include, from the microelectronic device to the bump, a silicon layer, a silicon dioxide layer, a first titanium layer, an aluminum layer, a second titanium layer, and a nickel-vanadium alloy layer, although this representative under bump metallurgy is not required. Other under bump metallurgies known in the arts may also optionally be employed in embodiments of the invention.

The bump 230 may represent a contact, such as a post, peak, mound, convexity, sphereoid, thin bump, or other abrupt protuberance over the active surface of the microelectronic device. Suitable conductive materials for the bump include, but are not limited to, copper and copper-containing conductive materials. Other materials that are also potentially suitable include other metals that form an IMC with a material of the solder joint, metals that have rates of migration that are greater than copper, and metals that have rates of migration that are greater than a barrier material. For example, metals that have rates of electromigration that are greater than nickel, cobalt, titanium, iron, or combinations of such barrier metals may potentially be suitable for the bumps. In one particular embodiment of the invention, the bump may contain copper or a copper-containing metal, has a generally spherical, or at least spheroidal shape, and has a diameter in a range between about 10 to 100 micrometers (μm, a unit of length equal to one millionth of a meter), for example about 50 μm.

Referring again to FIG. 2, the pad 250 is coupled to a contact surface 262 of the substrate 260. Suitable substrates include, but are not limited to, boards, circuit boards, printed circuit boards (PCBs), flexible polymeric substrates, ceramic substrates, substrates for single chip modules, substrates for multi chip modules, and other substrates conventionally employed in flip chip and other microelectronic devices. The illustrated pad represents an elevated pad, although this is not required, and other pads, such as recessed pads, concave pads, or convex pads, may also optionally be employed. The pad may contain a conductive material, such as a metal. The metals discussed above that are suitable or potentially suitable for the bump are also suitable or potentially suitable for the pad. In one particular embodiment of the invention, the pads may contain copper or a copper-containing material. For example, the pads may contain a copper-nickel-copper stack.

A solder joint 240 is disposed between the bump 230 and the pad 250. The solder joint generally contains a conductive material, such as an alloy, eutectic, or other metal. In one embodiment of the invention, the solder may include a tin-containing solder. For example, the solder may include a tin-lead solder, or a lead-free solder, such as a tin-gold solder, tin-silver solder, tin-copper solder, tin-silver-copper solder, or a combination thereof.

A first barrier material 235 overlies a surface of the bump 230 and a second barrier material 245 overlies a surface of the pad 250. At least a portion of the first barrier material 235 is disposed between the bump 230 and the solder joint 240, and at least a portion of the second barrier material 245 is disposed between the solder joint 240 and the pad 250. In the illustrated embodiment, the first and the second barrier materials are on vertical sidewalls of the bump and the pad, respectively, although this is not required. In an alternate embodiment of the invention, the first and the second barrier materials may be omitted from the vertical sidewalls of the bump and the pad, as long barrier materials remain between at least one of the bump and the solder joint, or the pad and the solder joint. It should be noted that terms such as "vertical", "above", "below", and the like, are used herein only to facilitate the description of the structure of the microelectronic package illustrated. It will be evident that the packages and interconnect structures may be used in a variety of orientations, including upside down orientations, and tilted orientations.

Suitable barrier materials for copper and copper-containing pads and bumps and tin-containing solder joints include, but are not limited to, nickel, cobalt, titanium, iron, and combinations thereof. The barrier materials may help to prevent, or at least delay, intermixing of materials on opposite sides thereof due to electromigration, or other transport phenomena. The first barrier material may help to reduce intermixing of bump and solder materials, and the second barrier material may help to reduce intermixing of pad and solder materials. These barrier materials may help to separate, and prevent contact between, materials of the solder joint and the bump or the pad. In the case of a copper-containing bump or pad and a tin-containing solder joint, the barrier materials may help to prevent, or at least delay, the formation of copper-tin IMCs. For example, the barrier materials may help to prevent or at least reduce the rapid early growth of IMCs during solder reflow and baking. Preventing or delaying the formation of IMCs may help to reduce the formation of cracks and other defects due at least in part to electromigration.

Nickel, cobalt, titanium, iron, and combinations of these barrier materials have lower solid-state diffusion coefficients than copper in tin (see for example pages 1325–1326 of Smithells Metals Reference Book, 7th Ed, by Colin J. Smithells et al., Butterworth-Heinemann publisher, 1998). The solid-state diffusion coefficients decrease in order from copper, to nickel, to cobalt, to titanium, to iron, and finally to tin. The diffusion coefficient of copper is about two orders of magnitude larger—or 100 times larger—than the diffusion coefficient of nickel, and about four orders of magnitude larger—or 10,000 times larger—than the diffusion coefficients of cobalt, titanium, and iron. The use of nickel, cobalt, titanium, iron, and combinations of these materials may help to slow movement resulting from driving forces, such as electromigration, back stress, chemical gradient driven diffusion, and temperature gradient driven diffusion, and may generally reduce crack formation, and improve device reliability.

Nickel, cobalt, titanium, iron, and combinations of these materials generally also provide good mechanical adhesion to the bump (or the pad) and to the solder joint. Moreover, these barrier materials also often provide a stable interface that doesn't grow excessively during temperature excursions, such as may occur during multiple reflows in a baking process. Other barrier materials may also optionally be employed, as long as they have appropriate mechanical adhesion, provide an appropriately stable interface, do not form IMCs which tend to form cracks, and move or electromigrate at a slower rate than copper in a tin-containing solder.

The amount of the barrier material may be selected to reduce electromigration and defect formation to a desired extent. The barrier materials may include layers, caps, or other structures having a thickness between the solder joint and either the bump or the pad that is in a range between about 0.01 to 20 µm, or about 0.05 to 10 µm. A smaller thickness may optionally be employed, but may provide a smaller electromigration barrier, and a greater thickness may optionally be employed, but may provide a greater amount of thermo-mechanical stress.

The barrier materials may be formed over the bump or the pad prior to assembly of the microelectronic device over the substrate, by approaches that include, but are not limited to, depositions, such as physical vapor deposition, and plating, such as electroplating or electroless plating. The barrier material may be deposited,-plated, or otherwise formed on at least a portion or extremity of a bump that is most distant from an under bump metallurgy. A barrier material may also be deposited, plated, or otherwise formed on at least a contact surface of a pad prior to introducing a solder material or bump over the contact surface of the pad. Then, the bump having the barrier material formed thereon may be placed into position relative to the solder material or bump over the contact surface of the pad. Then, the solder material or bump may be reflowed to form a solder joint that couples the pad with the bump through the barrier materials.

Such barrier materials may help to reduce cracks and other defects caused by electromigration and may be useful in improving the reliability and operational life of microelectronic packages. Experiments indicate that a nickel barrier material may significantly reduce the number of cracks and other defects that form in a flip chip microelectronic package. The barrier materials may also allow higher current densities to be employed. Estimations based on electromigration theory suggest that the barrier materials may allow the current carried per bump to be increased by 100% to 200%, or even more, as a result of the barrier materials. This may enable new generations of flip chip and other microelectronic devices, which employ ever-higher current densities.

Referring again to FIG. 2, in the illustrated embodiment, a portion of the first barrier material between the bump and the solder joint is subjacent to the bump and superjacent to the solder joint. The first barrier material contacts the bump and the solder joint. Likewise, a portion of the second barrier material between the pad and the solder joint is superjacent to the pad and subjacent to the solder joint. The second barrier material contacts the pad and the solder joint. However, direct contact of the barrier materials with the bump, solder joint, or pad, is not required. Other materials may potentially be disposed between the barrier material and the bump, between the barrier material and the pad, or between the barrier material and the solder joint. For example, the first barrier material may overlie the solder joint, with another material disposed between the solder joint and the first barrier material. Also, the first barrier material may underlie the bump, with another material disposed between the bump and the first barrier material. The same is generally true of the second barrier material. The second barrier material may overlie the pad, with another material disposed between the pad and the second barrier material. Further, the second barrier material may underlie the solder joint, with another material disposed between the solder joint and the second barrier material.

Figure 3:
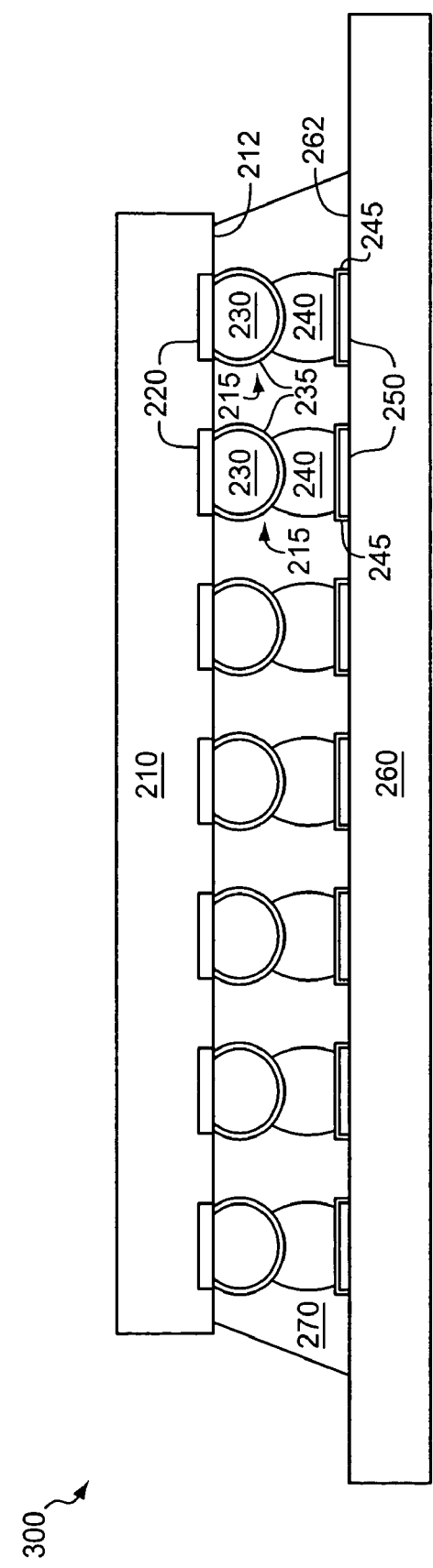
FIG. 3 shows a cross-sectional view of a flip chip microelectronic package containing an interconnect structure having electromigration barrier materials disposed between a bump and a solder joint, and between the solder joint and a pad, according to one embodiment of the invention.

FIG. 3 shows a cross-sectional view of a flip chip microelectronic package 300 containing a microelectronic device 210, a substrate 260, a plurality of interconnect structures 215 containing barrier materials as disclosed herein coupling the microelectronic device with the substrate, and an optional underfill material 270 disposed between the microelectronic device and the substrate around the interconnect structures, according to one embodiment of the invention. The barrier materials are believed to be useful for flip chip microelectronic packages, due at least in part to the smaller interconnect structures employed therein, the higher current densities, and the generally greater significance of electromigration related defects. However, flip chip microelectronic packages are not required. In an alternate embodiment of the invention, an interconnect structure including one or more barrier materials, as disclosed herein, may be included in a ball grid array (BGA) or other non-flip chip microelectronic package.

Figure 4:
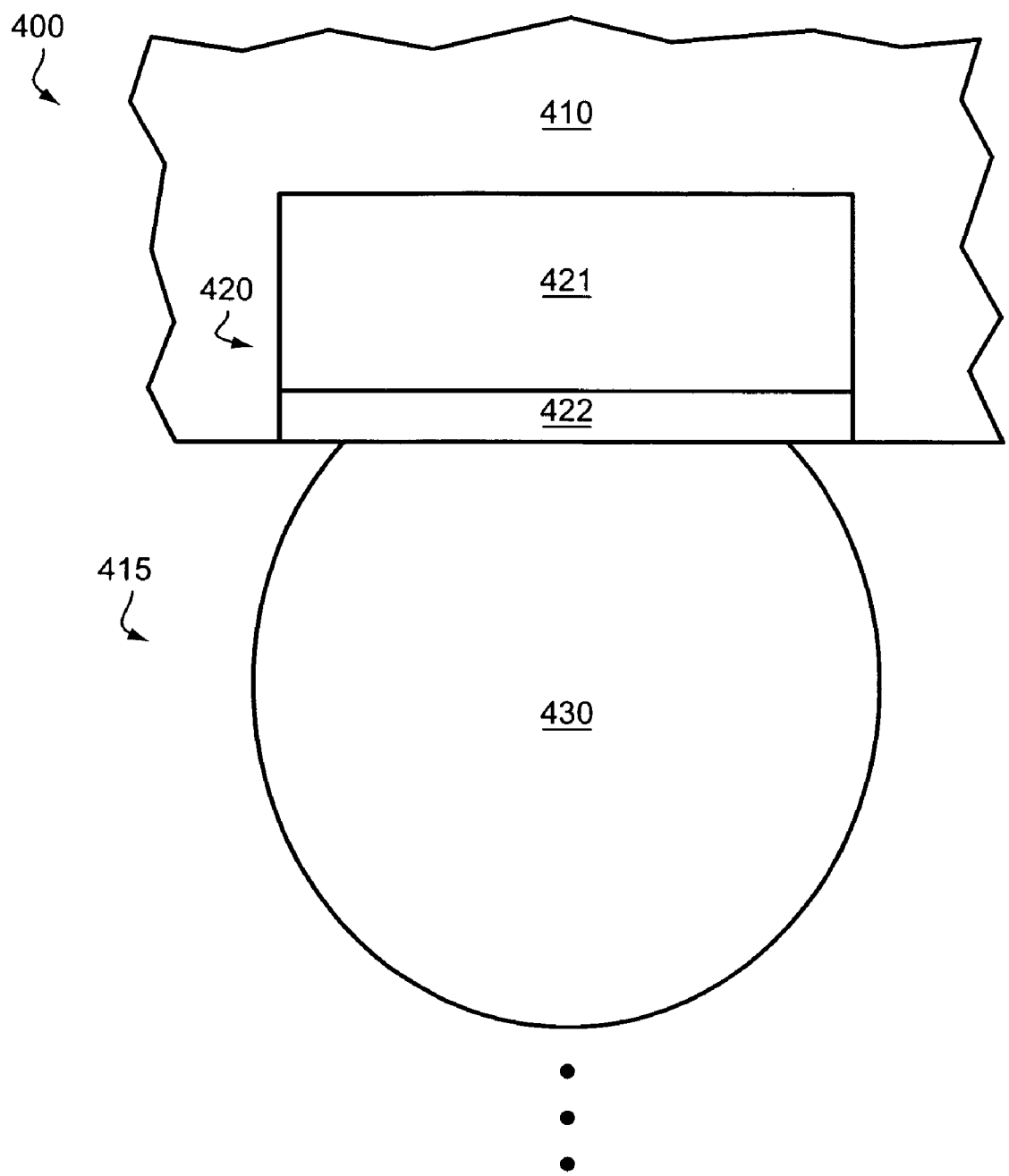
FIG. 4 shows a cross-sectional view of a portion of a flip chip microelectronic package containing an interconnect structure having an electromigration barrier material included in an under bump metallurgy disposed between a solder bump and a microelectronic device, according to one embodiment of the invention.

FIG. 4 shows a cross-sectional view of a portion of a flip chip microelectronic package 400 containing an interconnect structure 415 having an electromigration barrier material 422 included in an under bump metallurgy 420 disposed between a solder bump 430 and a microelectronic device 410, according to one embodiment of the invention. The solder bump may include a tin-lead, tin-silver, tin-copper, or other tin-containing solder bump. The under bump metallurgy includes a stack 421 of under bump metallurgy materials, and the electromigration barrier material 422 disposed between the stack and the solder bump 430.

The stack 421 may include layers or other structures of under bump metallurgy materials traditionally employed in flip chip and other microelectronic packages. In one specific instance, the stack may include, from the microelectronic device to the electromigration barrier material, a silicon layer, a silicon dioxide layer, a first layer of titanium, a layer of aluminum under the first layer of titanium, a second layer of titanium under the layer of aluminum, a layer of nickel-vanadium alloy under the second layer of titanium, although this specific stack is not required, and other stacks known in the arts may also optionally be employed.

The electromigration barrier material may be similar to the electromigration barrier materials discussed above. For example, the barrier materials may include nickel, cobalt, titanium, iron, or a combination thereof. The barrier material may include a layer or other structure having a thickness in a range between about 0.01 to 20 µm, or about 0.05 to 10 µm. The electromigration barrier materials may be formed over the stack before printing or otherwise introducing the bump by approaches that include, but are not limited to, depositions, such as physical vapor deposition, and plating, such as electroplating or electroless plating. A potential advantage of the electromigration barrier material is reducing, or at least delaying, the formation of cracks or other defects that may otherwise occur inside the solder bump near the interface between the solder bump and the under bump metallurgy.

The microelectronic packages discussed above may be used in a variety of electrical devices known in the arts. Suitable electrical devices include, but are not limited to, computer systems, multimedia products, audiovisual products, televisions, communication devices, cellular phones, video cameras, and the like.

Figure 5:
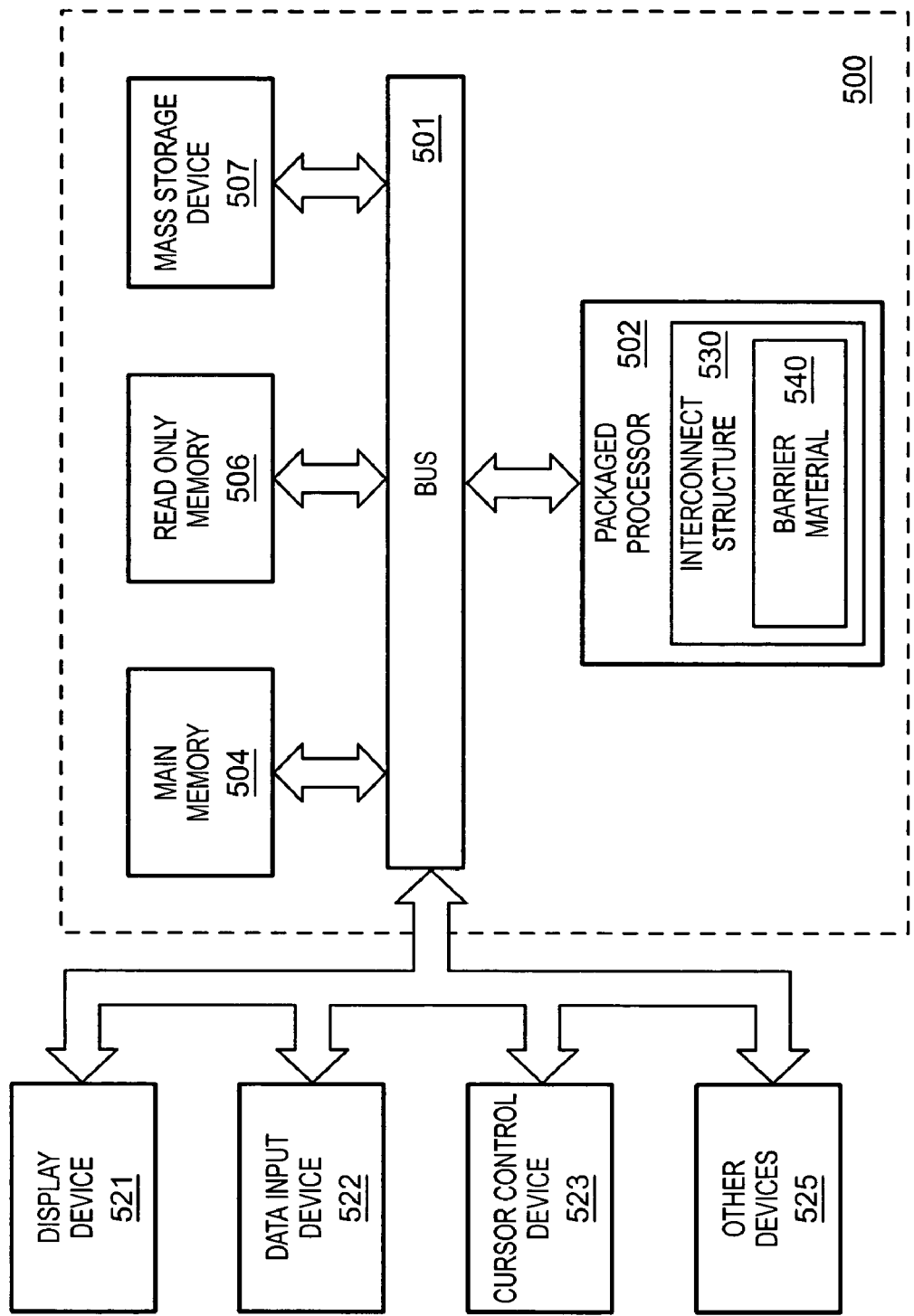
FIG. 5 shows an exemplary computer system in which an embodiment of the invention may be implemented.

A computer system 500 representing an exemplary laptop, desktop, workstation, host, or server in which an embodiment of the invention may be implemented will now be described with reference to FIG. 5. The computer system contains a bus 501 to communicate information, and a packaged processor 502 coupled with the bus 501 to process information. In one embodiment of the invention, the processor 502 may be included in a flip chip or other microelectronic package as discussed herein. The packaged processor may include an interconnect structure 530 including one or more barrier materials 540. The interconnect structure and the one or more barrier materials may be similar to the interconnect structure 215 and barrier materials 235, 245, shown in FIGS. 2 and 3. The computer system 500 further comprises a random access memory (RAM) or other dynamic storage device 504 (referred to as main memory), coupled with the bus 501 to store information and instructions to be executed by the processor 502. The main memory 504 also may be used to store temporary variables or other intermediate information during execution of instructions by the processor 502. Different types of memories that are employed in some, but not all, computer systems include DRAM memories, SRAM memories, and Flash memories. The computer system 500 also comprises a read only memory (ROM) and other static storage devices 506 coupled with the bus 501 to store static information and instructions for the processor 502, such as the BIOS. A mass storage device 507 such as a magnetic disk, zip, or optical disc and its corresponding drive may also be coupled with the computer system 500 to store information and instructions.

The computer system 500 may also be coupled via the bus 501 to a display device 521, such as a cathode ray tube (CRT) or liquid crystal display (LCD), to display information to an end user. Typically, a data input device 522, such as a keyboard or other alphanumeric input device including alphanumeric and other keys, may be coupled with the bus 501 to communicate information and command selections to the processor 502. Another type of user input device is a cursor control device 523, such as a mouse, a trackball, or cursor direction keys, to communicate direction information and command selections to the processor 502 and to control cursor movement on the display 521. Other devices 525, such as a network interface, a communication interface, an audio device, and a video input device, may be coupled with the bus 510 in some, but not all, computer systems.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
forming a first barrier material over a bump that is already attached to a microelectronic device, wherein the first barrier material comprises one or more of nickel, cobalt, iron, and titanium;
forming a second barrier material over a pad including multiple layers of different materials attached to a substrate, wherein the second barrier material comprises one or more of nickel, cobalt, iron, and titanium;
introducing a solder material directly on the second barrier material;
placing the bump having the first barrier material formed thereon in position relative to the solder material;
reflowing the solder material to form a solder joint that couples the pad with the bump through the first and the second barrier materials.

2. The method of claim 1, wherein at least one of said forming the first barrier material and said forming the second barrier material comprises depositing or plating.

3. The method of claim 2, wherein at least one of the first barrier material and the second barrier material comprises one or more of cobalt, iron, and titanium.

4. The method of claim 1, wherein said forming the first barrier material over the bump comprises depositing the first material over the bump after the bump is attached to the microelectronic device.

5. The method of claim 1, further comprising forming a third barrier material between a stack of under bump metallurgy materials and the bump.

6. The method of claim 1, wherein the bump comprises copper, and wherein the solder material comprises tin.

7. The method of claim 1, wherein the first barrier material comprises one or more selected from iron and titanium.

8. A method comprising:
forming a barrier material over a bump that is attached to a microelectronic device, wherein the barrier material comprises one or more of nickel, cobalt, iron, and titanium;
introducing a solder material over a pad attached to a substrate;
placing the bump having the barrier material formed thereon in position relative to the solder material;
reflowing the solder material to form a solder joint that couples the pad with the bump through the barrier material.

9. The method of claim 8, wherein the barrier material comprises one or more of cobalt, iron, and titanium.

10. The method of claim 8, wherein said forming the barrier material comprises one selected from depositing and plating.

11. The method of claim 8, further comprising forming a second barrier material between the pad and the solder material, wherein the second barrier material comprises one or more selected from nickel, cobalt, iron, and titanium.

12. The method of claim 8, further comprising forming a third barrier material between the bump and a stack of under bump metallurgy materials, wherein the third barrier material comprises one or more selected from nickel, cobalt, iron, and titanium.

13. The method of claim 8, wherein the bump comprises copper, and wherein the solder material comprises tin.

14. The method of claim 8, wherein the barrier material comprises cobalt.

15. The method of claim 8, wherein the barrier material comprises iron.

16. The method of claim 8, wherein the barrier material comprises titanium.

* * * * *